(12) United States Patent
Apostolov et al.

(10) Patent No.: US 11,646,580 B2
(45) Date of Patent: May 9, 2023

(54) ELECTRICAL POWER SYSTEM WITH IMPROVED FUNCTIONAL SECURITY

(71) Applicant: OMICRON ELECTRONICS GMBH, Klaus (AT)

(72) Inventors: Alexander Apostolov, Los Angeles, CA (US); Andreas Klien, Götzis (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 269 days.

(21) Appl. No.: 17/081,163

(22) Filed: Oct. 27, 2020

(65) Prior Publication Data

US 2022/0131377 A1 Apr. 28, 2022

(51) Int. Cl.
*G01R 31/52* (2020.01)
*H02J 3/00* (2006.01)
*G01R 19/25* (2006.01)

(52) U.S. Cl.
CPC ........ *H02J 3/0012* (2020.01); *G01R 19/2513* (2013.01); *G01R 31/52* (2020.01)

(58) Field of Classification Search
CPC ........ G01R 31/52; G01R 31/54; G01R 31/58; G01R 31/62
See application file for complete search history.

(56) References Cited

U.S. PATENT DOCUMENTS

| 6,496,342 B1 * | 12/2002 | Horvath | ............ H02J 13/00002 361/64 |
| 10,079,486 B2 | 9/2018 | Hong et al. | |
| 10,338,111 B2 | 7/2019 | Klien et al. | |
| 2012/0242365 A1 * | 9/2012 | Singh | .................... G01R 31/343 324/762.01 |
| 2013/0320903 A1 * | 12/2013 | Aalund | ............... H02P 29/0241 318/490 |
| 2014/0058689 A1 * | 2/2014 | Klien | ..................... H04L 63/14 702/60 |

(Continued)

FOREIGN PATENT DOCUMENTS

| CN | 108 291 812 | 7/2018 |
| EP | 2 701 340 | 10/2017 |

(Continued)

OTHER PUBLICATIONS

Int'l Search Report (Form PCT/ISA/210) conducted in counterpart Int'l Appln. No. PCT/EP2021/079445 (dated Feb. 4, 2022).

(Continued)

*Primary Examiner* — Patrick Assouad
*Assistant Examiner* — Demetrius R Pretlow
(74) *Attorney, Agent, or Firm* — Greenblum & Bernstein, P.L.C.

(57) ABSTRACT

To improve functional security in electric power systems, a fault detector is provided in the electric power system that is connected to the data communication bus and that evaluates streamed values of at least one process parameter. In order to detect an electric fault in the electric power system, the fault detector is arranged to send a fault present indication to the switching element when an electric fault is detected. The fault present indication is sent to and received by the switching element, before the tripping operation of the switching element is triggered upon receipt of the switching command from the automation system, and the switching element triggers the tripping operation of the switching element only when a fault present indication has been received.

12 Claims, 3 Drawing Sheets

(56) References Cited

U.S. PATENT DOCUMENTS

| | | | |
|---|---|---|---|
| 2014/0107955 A1* | 4/2014 | Thompson | G01R 31/343 |
| | | | 702/58 |
| 2014/0218044 A1* | 8/2014 | Ostrovsky | H02H 1/0015 |
| | | | 340/650 |
| 2014/0361785 A1* | 12/2014 | Radan | H02H 7/261 |
| | | | 324/521 |
| 2016/0202304 A1* | 7/2016 | Beierschmitt | H02H 3/10 |
| | | | 324/750.01 |
| 2016/0274169 A1 | 9/2016 | Cui et al. | |
| 2016/0320785 A1* | 11/2016 | Kondabathini | H02H 3/00 |
| 2017/0163029 A1* | 6/2017 | Hong | H02H 7/262 |
| 2017/0195362 A1 | 7/2017 | Schweitzer, III et al. | |
| 2020/0358283 A1 | 11/2020 | Cui et al. | |
| 2021/0111555 A1* | 4/2021 | Schweitzer, III | H02J 13/0004 |
| 2021/0249853 A1 | 8/2021 | Manditereza et al. | |
| 2022/0021195 A1* | 1/2022 | Rathi | H02H 3/167 |

FOREIGN PATENT DOCUMENTS

| | | |
|---|---|---|
| WO | 2016/149699 | 9/2016 |
| WO | 2020/107041 | 5/2020 |

OTHER PUBLICATIONS

Int'l Written Opinion (Form PCT/ISA/237) conducted in counterpart Int'l Appln. No. PCT/EP2021/079445 (dated Feb. 4, 2022).

Not. of Transmittal (Form PCT/ISA/220) conducted in counterpart Int'l Appln. No. PCT/EP2021/079445 (dated Feb. 4, 2022).

Hong et al., "Cyber Attack Resilient Distance Protection and Circuit Breaker Control for Digital Substations," *IEEE Transactions on Industrial Information*, IEEE Service Center, New York, vol. 15, No. 7, XP011734070, ISSN: 1551-3203, DOI: 10.1109/TII.2018. 2884728, sections II, IV, pp. 4332-4341 (Jul. 1, 2019).

\* cited by examiner

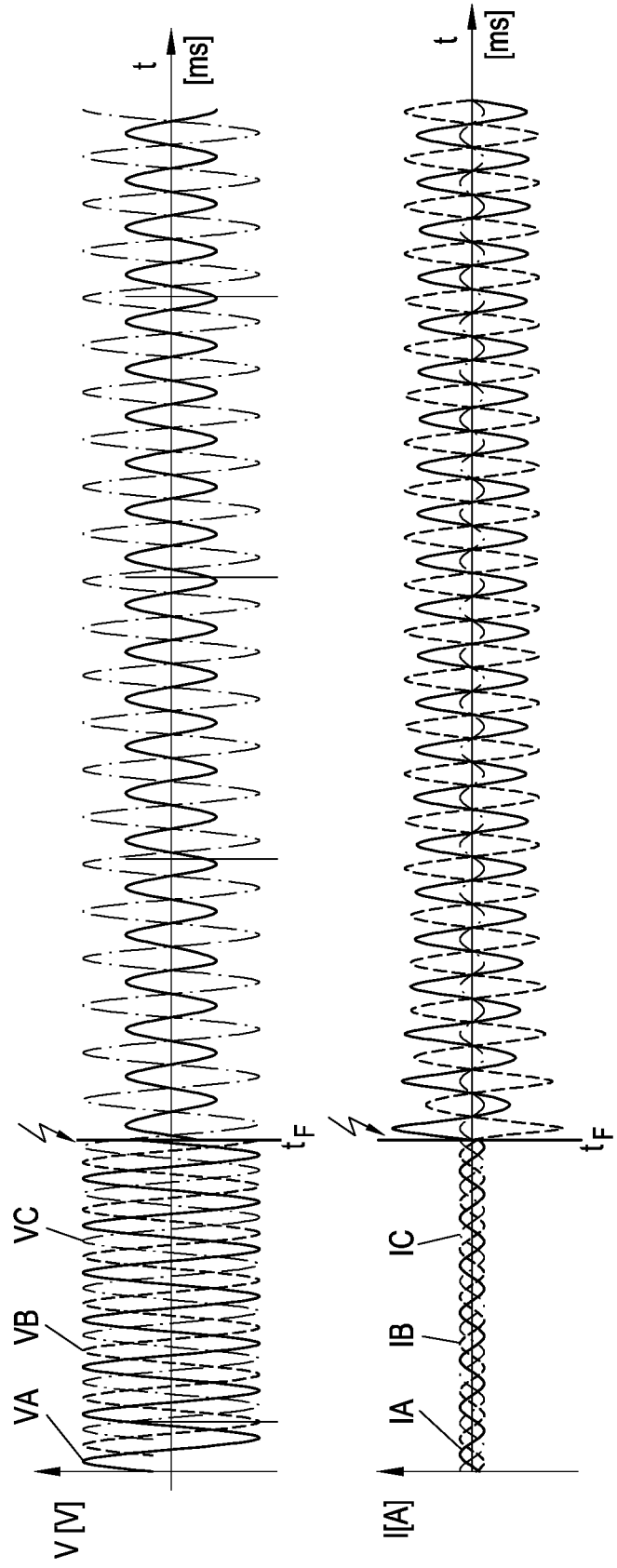

ELECTRICAL POWER SYSTEM WITH IMPROVED FUNCTIONAL SECURITY

BACKGROUND

1. Field of the Invention

Embodiments pertain to an electric power system with at least one switching element arranged on a primary element of the electric power system that guides the primary currents and primary voltages and with an automation system that operates the switching element, where the automation system sends a switching command to the switching element for triggering a tripping operation of the switching element, and with a measurement unit for detecting values of at least one process parameter of the electric power system, where the at least one process parameter is a cyclic electric signal of given frequency and nominal value, and the measurement unit is connected to a data communication bus over which sampled values of the at least one process parameter are streamed in data messages of a data communication protocol implemented on the data communication bus. Embodiments also pertain to a method for operating such an electric power system.

2. Discussion of Background Information

Electric power systems, like a power grid, e.g., for high and medium voltages, are widely used and basically comprise electric power generating stations, power transmission lines and electric power substations. The need to transmit power over longer distances, to perform voltage conversion in a transformer substation or to distribute power requires complex electric systems. For illustration, electric power substations for power distribution in high and medium voltage power networks include primary devices, sometimes also called field devices, such as electrical cables, lines, bus bars, switches, breakers, power transformers and instrument transformers. These primary devices may be operated in an automated way via a Substation Automation (SA) system responsible for controlling, protecting and monitoring of substations or parts thereof. The SA system comprises programmable secondary devices, so-called Intelligent Electronic Devices (IED), interconnected in a SA data communication network, and interacting with the primary devices via a process interface. Interaction between a primary device and a secondary device can be made by a so-called Process Interface Unit (PIU). Similarly, a wide variety of electric power systems may have an associated power utility automation system which includes IEDs that perform functions of controlling, protecting and monitoring operation of the respective electric power system. SA systems and power utility automation system are sometimes also generally designated as protection, automation and control (PAC) system. Communication between IEDs or PIUs and between IED or PIU and other components of an electric power system may be performed according to standardized data communication protocols. For illustration, the IEC standard 61850 "Communication Networks and Systems for Power Utility Automation" decouples the substation-specific application functionality from the substation communication-specific issues and to this end, defines an abstract object model for compliant substations, and a method how to access these objects over a communication network via an Abstract Communication Service Interface (ACSI).

The continuously growing digitalization and automatization of the electric power industry helps to significantly improve the efficiency of digital protection, automation and control systems. At the same time, it is opening the possibilities for malicious intrusion into the electric power system, substations or power plants by people located anywhere in the world. Cyber security for such systems is therefore becoming a major concern.

With an increasing degree of automation and with increasing usage of interconnected IEDs in electric power systems, there is also an increasing need to reliably detect critical situations in the protection, automation and control (PAC) system. Examples for such critical events include security intrusions, operator errors, timing issues, hardware faults or any critical or incorrect state of the electric power system and/or its power utility automation system.

In the field of computer networks in classical information technology (IT), Intrusion Detection Systems (IDSs) are used to monitor the network or the activity of systems in order to detect intrusions into the network or into network devices or malicious activities of unauthorized third-parties. An IDS monitors and analyses the data communication in the computer network. IDSs are designed to identify possible incidents, log information and report possible attempts. The primary function of IDSs is to alert the operator of the secured perimeter, so that he can take measures to prevent intrusion, to minimize the impacts of the attacks or to do post incident analysis. Signature-based network devices, for example, use predefined signatures of known attacks (like virus scanner signatures) to detect intrusions. This can be seen as a blacklist approach, where the network device alerts the operator if a behavior is observed which is explicitly forbidden in the sense that it is included in the blacklist. Such signature-based approaches are widely used in network devices in IT systems.

While the blacklist approach may also be used to detect critical events in power utility automation systems, there may be problems associated with such an approach. The blacklist approach requires a signature for each critical event which is to be identified. New or unknown attacks cannot be detected. In the context of electric power systems, the number of attacks and vulnerabilities known for control and automation systems in power systems and their special protocols is very low. Therefore, blacklist based IDSs applied to electric power systems would, to a great extent, only be able to detect attacks known from the IT domain. The usefulness of blacklist approaches is thus especially limited for IDSs in electric power systems.

Another layer of security is therefore required in electric power systems with a power utility automation system. Such security systems are based on a good understanding of the functionality of the electric power system and the principles of its operation. An example for such an improved security system can be found in EP 2 701 340 A1. Therein, a configured system model of the power system is used to monitor and evaluate data messages sent between IEPs to detect a critical event during operation of the power system. The data content of a data message which includes process parameter of a primary device to determine whether the data content correspond to valid behavior of the electric power system and the power utility automation system. To that end anticipated data messages are predicted based on the system model and the predicted data messages are compared to monitored data messages. With such a message analysis it is possible to detect an intrusion, for example in the form of an injected malicious data message. Although the intrusion may be detected, a possible reaction on the malicious data message could be too late to prevent its impact on the electric power system. If the injected data message carries information that causes circuit breakers of the power system or substation to trip, the malicious data message could cause a significant power outage. In other words, the intrusion will be detected when it is too late.

As a countermeasure, techniques for encrypting data messages or so-called Message Authentication Codes added to each data message could be used, e.g., as defined in IEC 62351. Such cryptographic signatures in data messages enable the recipient of the data message to verify its authenticity and the integrity of the data message. However, this approach requires a cryptographic key or certificate distribution system to be introduced into the electric power system or electric substation infrastructure which increases the complexity of the system. Apart from that, this measure is only effective if the underlying key or certificate infrastructure is not compromised. The key or certificate distribution system, e.g., a server, is the single point of failure in this approach and could be attacked by an adversary to either intercept or influence the authentication keys or certificates distributed to all message publishers. Therefore, although this approach increases the hurdles for the malicious intruder, it is nevertheless susceptible to malicious attacks.

Another approach for increased functional security in electric power systems with power utility automation is given in U.S. Pat. No. 10,079,486 B2. With this method a data message comprising a command to open or close a circuit breaker in the electric substation is analyzed using a power flow model of the substation and of neighboring substations. The power flow model is used to determine predicted voltages for a number of nodes in the substation and in neighboring substations if the switch command in the data message were executed. The predicted voltages are compared to configured allowable voltage ranges and execution of the switch command is blocked if a predicted voltage is outside of its corresponding allowable voltage range. This means that the execution of the switch command is delayed until the analysis of the data message has been completed. Such time delays will, however, in many cases not be acceptable. On the other hand, the analysis relies on a steady-state physical system model. This is a very simplistic approach, because the power flow and the voltage values at the substations depend on many factors that may be beyond a considered neighboring substation. This means that the intrusion detection system can make a false decision and could block a legitimate command from a system operator or from the power utility automation system. This could pose a significant security hazard and could lead to damage or even destruction of power system or substation components or to severe or even lethal accidents of persons working in the power system or substation.

Consequently, there is a need to improve functional security in electric power systems.

SUMMARY

In embodiments, a fault detector is provided in the electric power system that is connected to the data communication bus and that evaluates the streamed values of the at least one process parameter, in order to detect an electric fault in the electric power system. The fault detector is arranged to send a fault present indication to the switching element when an electric fault is detected, the fault present indication is sent, and received by the switching element, before the tripping operation of the switching element is triggered upon receipt of the switching command. The switching element triggers the tripping operation of the switching element only if a fault present indication has been received.

By correlating a switching command for tripping a switching element in the electric power system with the actual electric state of the electric power system, wrong tripping of the switching element, which can be caused by injected malicious data messages containing wrong switching commands or wrong process parameter values, can be prevented. The actual electric state is evaluated by the fault detector on basis if the streamed samples of the process parameter. Only when these sampled values of the process parameter indicate an electric fault (short circuit fault) a fault present indication is sent to the switching element that enables the switching operation. As the value of the process parameter is sampled and streamed several times per cycle of the process parameter, an electric fault can be detected much faster than a switching operation is performed. This allows the fault detector to enable the switching operation with the fault present indication well ahead in time of the actual switching operation. Therefore, injected malicious data messages, that would otherwise cause tripping operation of the switching element, cannot cause any harm. This improves the functional safety in the electric power system.

Embodiments are directed to a method for operating at least one switching element of an electric power system, the at least one switching element being arranged on a primary element of the electric power system that guides primary currents and primary voltages, and the at least one switching element being operated by an automation system of the electric power system. The method includes sending a switching command from the automation system to the at least one switching element for triggering a tripping operation of the switching element; detecting values of at least one electric process parameter of the electric power system by a measurement unit, the at least one process parameter being a cyclic electric signal of given frequency and nominal value; streaming sampled values of the detected values of the at least one process parameter over a data communication bus in data messages of a data communication protocol implemented on the data communication bus; evaluating the streamed values of the at least one process parameter by a fault detector connected to the data communication bus, in order to detect an electric fault in the electric power system; sending a fault present indication to the at least one switching element by the fault detector when an electric fault is detected, the fault present indication being sent, and received by the at least one switching element, before the tripping operation of the at least one switching element is triggered upon receipt of the switching command; and triggering the tripping operation of the at least one switching element only when a fault present indication has been received.

According to embodiments, the method can also include connecting the automation system to the data communication bus; connecting the at least one switching element to the data communication bus; and sending the switching command for triggering a tripping operation in a data message over the data communication bus to the switching element.

In other embodiments, the method can include connecting at least one of the measurement unit or the switching element to the communication bus via a process interface unit.

In still other embodiments, the method can include sending the fault present indication in a fault data message over the data communication bus.

According to embodiments, the process interface unit may receive measured values of the at least one process parameter from the measurement unit, sample the at least one process parameter with a given sampling rate and send the sampled values in data messages over the data communication bus.

In embodiments, the data messages with the sampled values of the at least one process parameter can be received and evaluated by the automation system to detect an erroneous state of the electric power system. The automation system can send the switching command to the switching element when it detects an erroneous state.

In other embodiments, the electric fault can be detected in the fault detector by comparing at least one actual value of the at least one process parameter with a corresponding past value of the at least one process parameter of a past cycle of the process parameter. The electric fault may be detected in the fault detector by comparing an actual value of the at least one process parameter with a mean value of a number of corresponding past values of the at least one process parameter of past cycles of the process parameter.

Embodiments are directed to an electric power system that includes a primary element; at least one switching element arranged on the primary element that guides primary currents and primary voltages; an automation system that operates the at least one switching element, the automation system sending a switching command to the at least one switching element for triggering a tripping operation of the at least one switching element, and a measurement unit for detecting values of at least one electric process parameter of the electric power system, the at least one process parameter being a cyclic electric signal of given frequency and nominal value; a data communications bus, the measurement unit being connected to the data communication bus over which sampled values of the at least one process parameter are streamed in data messages of a data communication protocol implemented on the data communication bus; and a fault detector that is connected to the data communication bus and evaluates the streamed values of the at least one process parameter, in order to detect an electric fault in the electric power system. The fault detector is arranged to send a fault present indication to the at least one switching element when an electric fault is detected, the fault present indication being sent to and received by the at least one switching element, before the tripping operation of the switching element is triggered upon receipt of the switching command, and the switching element triggers the tripping operation of the at least one switching element only when a fault present indication has been received.

In embodiments, the automation system and the at least one switching element may be connected to the data communication bus. The automation unit can send the switching command for triggering a tripping operation in a data message over the data communication bus to the at least one switching element.

According to embodiments, at least one of the measurement unit or the at least one switching element can be connected to the communication bus via a process interface unit.

In accordance with still yet other embodiments, the fault detector may send the fault present indication in a fault data message over the data communication bus.

Further advantageous embodiments of the invention and its effects follow from the following description of the invention.

BRIEF DESCRIPTION OF THE DRAWINGS

The present invention is described in greater detail in the following with reference to FIGS. 1 to 5, which show exemplary, schematic and non-limiting advantageous embodiments of the invention. In the drawings:

FIGS. 2 and 3 show typical electric faults in an electric power system;

DETAILED DESCRIPTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
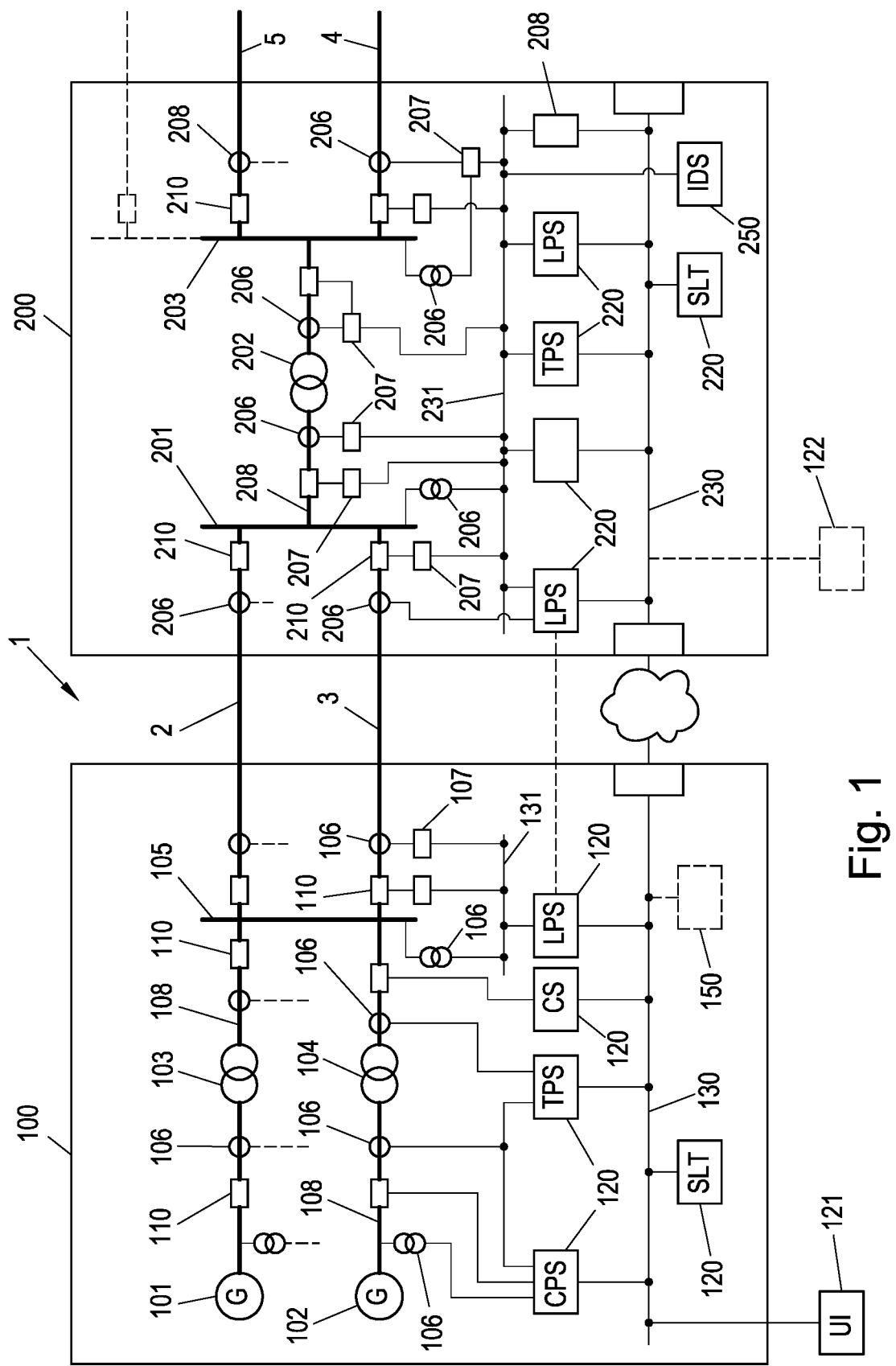
FIG. 1 shows an example of an electric power system.

To better understand the context of the invention a typical configuration of an electric power system 1 is explained by way of example with reference to FIG. 1. The electric power system 1 in the embodiment shown is an electric power grid and comprises two electric substations 100, 200, in this case a power plant (substation 100) and a transformer plant (substation 200), which are connected via transmission lines 2, 3. The electric power system 1 is depicted in form of a well-known so-called single line equivalent circuit diagram where connections are shown as single lines. It is to be understood, however, that lines in the diagram can represent multiphase electrical connections, e.g., in the form of three-phase cables, and that shown devices can also be multiphase devices, e.g., a three-phase power transformer or a three-phase circuit breaker.

In the substation 100, the electric power produced by two generators 101, 102 is transformed to high voltage (HV), e.g., 110 kV or 220 kV, with (step-up) transformers 103, 104 and is supplied to bus-bar 105. From the bus-bar 105, the electric power is transmitted to substation 200 via transmission lines 2, 3. The incoming lines are combined in substation 200 at bus-bar 201. The electric energy provided at bus-bar 201 is transformed to a different voltage level, e.g., to a lower HV voltage or to middle voltage (MV), e.g., 10 kV or 20 kV, with (step-down) transformer 202. The transformed electric power is supplied to bus-bar 203 from which the electric power can be distributed further, e.g., with transmission lines 4, 5 to further not shown substation(s) or consumer(s).

An electric power system 1 may of course comprise more than two substations, but also only one substation. It may also comprise other or different components like the ones shown in FIG. 1.

The production, transmission and distribution of the electric power takes place in the so-called primary elements that guide the primary currents and primary voltages, which together are referred to as primary parameters. The primary elements together are also referred to as the primary system. Primary elements are for example the generators 101, 102, transformers 103, 104, 202, bus-bars 105, 201, 203, transmission lines 2, 3, electric lines 108, 208 but also the switchgear described below and also other possible primary elements. Beside the primary system there is a further, so-called secondary system, which consists of protection and control devices (described below) as secondary elements. The secondary elements are usually not connected directly to the primary elements that usually carry electric power at high voltage levels. Therefore, instrument transformers, like current transformers or potential transformers, or other types of sensors are often used as measurement units 106, 206. An instrument transformer transforms a high primary voltage or a high primary current to a lower secondary voltage or lower secondary current (together referred to as secondary parameters). The transformations ratios between primary parameters and secondary parameters may vary but are known. The secondary parameters therefore are a representation of the primary parameters. Typically, secondary currents will lie in the range between 1 A to 5 A (at rated primary current) and secondary voltages in the range of 100V to 150V (at rated primary voltage). It is, however, also possible that primary parameters are directly measured by measurement units 106, 206. As primary and secondary parameters are equivalent, such parameters are referred to herein as process parameters.

Generally speaking, a process parameter represents a cyclic electric signal, e.g., an electric voltage or electric current, with given nominal frequency and nominal value (nominal voltage or nominal current) at a certain point of a substation 100, 200.

The substations 100, 200 further comprise a number of switching elements 110, 210 arranged on primary elements of the electric power system 1. A switching element 110, 210 can be arranged in electric lines 108, 208 of the substations 100, 200 or on another power system equipment of the electric power system 1, like a transformer 103, 104, 202, generator 101, 102, bus-bar 105, 201, 203, etc. Generally speaking, switching elements 110, 210 are able to interrupt the flow of electric power, e.g., over the electric line 108, 208, when in the open state and to guide electric power, over the electric line 108, 208, when in the closed state. There may be different types of switching elements 110, 210 installed in a substation 100, 200, like circuit breakers, interrupters, reclosers, disconnectors etc., but for the sake of simplicity all are referred to herein as switching elements 110, 210. The switching elements 110, 210 may be arranged at different positions in the substations 100, 200 and are therefore able to interrupt (tripping operation) or establish (closing operation) power flow at these different locations. For clarity reasons, only some of the switching elements 110, 210 shown in FIG. 1 are provided with their reference numeral.

In an automated electric power system 1, at least one of the switching elements 110, 210 is controlled and operated by a protection and control device 120, 220 (IEDs) of an automation system. There are various types of protection and control devices known, for example generator protection systems (GPS), transformer protection systems (TPS), line protection systems (LPS), a bus-bar protection system, a circuit breaker control system (CS), a protection system (SLT) for other parts of a substation 100, 200 etc. Protection and control devices 120, 220 of different substations 100, 200 may also be connected, as indicated with the dashed line in FIG. 1, for example to share information on certain process parameters. Protection and control devices 120, 220 may be multifunctional by incorporating several protection and/or control functions in one device. The protection and control function may be integrated into one device but could also be separated into several devices, one device that performs the protection function and another device that performs the control function. The protection function monitors the substation 100, 200 or parts thereof to detect faults, wrong operations or incorrect states. If such condition is detected, an associated control function is activated to carry out a switching operation by triggering a certain switching element 110, 210. As protection and control devices 120, 220 and their functions are well known in the art and is not relevant for the invention, these devices and functions are not explained in more detail.

A protection and control device 120, 220 may be designed as microprocessor-based hardware that runs certain software (that implements a protection and/or control function) installed on the hardware. A protection and control device 120, 220 may, however, also be implemented as programmable logic controller (PLC) or integrated circuit (IC) like an application-specific integrated circuit (ASIC) or field-programmable gate array (FPGA). Also, an implementation as analogue circuit or electromechanical device is conceivable. Combinations of such hardware devices and circuits are also possible.

At least one of the protection and control devices 120, 220 receives process parameters PP from at least one measurement unit 106, 206 installed in the corresponding substation 100, 200, but possibly also from other substation(s). A measurement unit 106, 206 may be connected directly to the associated protection and control device 120, 220, or may be connected to at least one of the protection and control devices 120, 220 via a data communication bus 131, 231, a so-called process bus.

At least some of the protection and control devices 120, 220 in a substation 100, 200 can be connected by a data communication bus 130, 230, a so-called station bus.

Communication buses 130, 131, 230, 231 may be separate data buses but could also be implemented as single data communication bus. In case of separate data buses, the buses could also be connected, for example using network switches, routers or similar network devices 208 (as in FIG. 1). Communication buses 130, 131, 230, 231 of different substations 100, 200 could also be connected, as indicated in FIG. 1 via LAN, WAN, WiFi or other networks or data connections, for example.

A suitable data communication protocol may be used for the data communication over the data communication bus 130, 131, 230, 231. A possible data communication bus and data communication protocol is implemented in accordance with standard IEC 61850, although any other communication bus and communication protocol could be used as well. It is also possible to use different data communication protocols in a station bus and process bus or in busses of different substations 100, 200.

A measurement unit 106, 206 may be connected directly to the communication bus 130, 131, 230, 231 when the measurement unit 106, 206 is provided with a corresponding communication interface. In this case, the analogue process parameters PP would be digitized first to be sent as data in data messages of the data communication protocol.

It is also possible to provide process interface units 107, 207 (PIU) that may be used to connect a measurement unit 106, 206 or a switching element 110, 210 to a communication bus 130, 131, 230, 231. A process interface unit 107, 207 that connects a measurement unit 106, 206 to a communication bus 130, 131, 230, 231 is also called merging unit. A merging unit may also be connected to several measurement units 106, 206. A process interface unit 107, 207 that connects a switching element 110, 210 to a communication bus 130, 131, 230, 231 is also called switchgear interface unit. A process interface unit 107, 207 may also serve as merging unit and as switchgear interface unit. A process interface unit 107, 207 could also be integrated into a switching element 110, 210 or into a measurement unit 106, 206.

A process interface unit 107, 207 (e.g., merging unit) would collect process parameters PP of the connected measurement units 106, 206 at a given sample rate and would send the process parameters PP as data in data messages over the corresponding communication bus 130, 131, 230, 231. A process interface unit 107, 207, for example, receives process parameters PP from measurement unit 106, 206 and sends the received process parameter PP in digitized form in a data message of the implemented data communication protocol. With IEC 61850, so-called GOOSE data messages are used which are event-driven data messages that are only sent when there is a change in the content of the data to be sent, i.e., when the process parameter PP changes. A process interface unit 107, 207 (e.g., switchgear interface unit) may receive data messages with switching commands for switching elements 110, 210 connected to the process interface units 107, 207. The process interface unit 107, 207 would generate switching commands for the corresponding switching element 110, 210 if a corresponding data message is received.

In operation, a process interface unit 107, 207, for example, receives a process parameter PP of a connected measurement unit 106, 206 and sends the process parameter PP over a communication bus 130, 131, 230, 231 to an associated protection and control device 120, 220 of the automation system of the electric power system 1. The protection and control device 120, 220 uses the received process parameter PP, and possibly also further or additional data of the electric power system 1, e.g., other process parameters, to assess the status of the electric power system 1 or a substation 100, 200 or a part thereof. If a wrong status or an erroneous state or any other fault is detected, the protection and control device 120, 220 sends a switching command for a certain switching element 110, 210 in a data message over the communication bus 130, 131, 230, 231. The data message is received by the process interface unit 107, 207 the switching element 110, 210 is connected to. The process interface unit 107, 207 then triggers the requested switching action at the switching element 110, 210.

In another possible scenario of operation, an operator enters a switching command for a certain switching element 110 via a user interface (UI) 121 of a control station. Instead of or in addition to an user interface 121 also an external control device 122 (e.g., a control center or SCADA (supervisory control and data acquisition) system) could send data messages with switching commands over the communication bus 130, 131, 230, 231, as indicated with dashed lines in FIG. 1. The user interface 121 or external control device 122 is connected to a communication bus 130, 131, 230, 231 via a data communication interface and sends a data message with the switching command to the process interface unit 107, 207 the respective switching element 110, 210 is connected to. The process interface unit 107, 207 triggers the requested switching operation of the switching element 110, 210 upon receipt of the data message.

It is to be noted that the configured address of the sending device and/or the address of the receiving device of a data message is usually contained in a respective data field of a data message. It is also possible to implement a publisher/subscriber mechanism, like in IEC 61850 based data communication. In this case, a network device would be subscribed to certain publishing network devices. A publishing network device would multicast a data message over a communication bus 130, 131, 230, 231 and would be read only by a subscriber of the publishing network device. Addresses or publisher/subscriber relationships could be configured before operation starts or could also be changed during operation. Also, other data communication mechanisms could be implemented. For the understanding of the invention, it is sufficient to assume that a network device connected to a communication bus 130, 131, 230, 231, like a process interface unit 107, 207 or a protection and control device 120, 220, recognizes that a data message sent over the communication bus 130, 131, 230, 231 is destined for itself. A network device discards data messages not destined for itself.

In a malicious attack on the electric power system 1 someone could inject a data message with malicious content into the communication network of the electric power system 1 or of a substation 100, 200 thereof. The malicious content could comprise an illegitimate switching command or wrong process parameter that trigger a switching command. Such an intrusion or injection of a malicious data message by an intruder shall be detected by the invention to prevent harmful and false switching operations.

The invention exploits the fact that measurement units 106, 206 that communicate with protection and control devices 120, 220 via a communication bus 130, 131, 230, 231 send their process parameters PP in data messages over the data communication bus 130, 131, 230, 231. The data messages sent over the communication bus 130, 131, 230, 231 are monitored by an intrusion detection system 150, 250 that is connected to the communication bus 130, 131, 230, 231 over which the data messages are sent. It is of course possible that an intrusion detection system 150, 250 is provided in several or all substations 100, 200. The intrusion detection system 150, 250 could subscribe to all publishing process interface units 107, 207 of a substation 100, 200, could read data messages within a certain sending address space or could read all data messages sent on the communication bus 130, 131, 230, 231. It is also possible that an intrusion detection system 150, 250 monitors only data messages of certain (at least one) publishing process interface units 107, 207. To be able to read data messages sent over the communication bus 130, 131, 230, 231, the intrusion detection system 150, 250 could be connected to a test access point (TAP) device that is connected to the communication bus 130, 131, 230, 231 and reads data messages sent over the communication bus 130, 131, 230, 231 or could be connected to a mirror port on a network switch connected to the communication bus 130, 131, 230, 231, for example. The intrusion detection system 150, 250 could also receive information on process parameters of other substations 100, 200. However, the intrusion detection system 150, 250 could also be hard-wired to certain measurement units 106, 206 to directly receive process parameters.

The intrusion detection system 150, 250 receives process parameters of at least one measurement unit 106, 206 of a substation 100, 200, usually, but not necessarily, the substation in which the intrusion detection system 150, 250 is arranged. A fault detector 300 of the intrusion detection system 150, 250 is then able to match the received process parameters with known behavior of the electric power system 1, especially when a short circuit fault occurs, like a single phase to ground or phase-to-phase fault, for example.

The intrusion detection system 150, 250 or the fault detector 300 may be implemented as microprocessor-based hardware that runs certain software or processes installed on the hardware. The fault detector could be implemented as software that runs on computer hardware of the intrusion detection system 150, 250, but could also be implemented as separate device. An intrusion detection system 150, 250 or fault detector 300 may, however, also be implemented as programmable logic controller (PLC) or integrated circuit (IC) like an application-specific integrated circuit (ASIC) or field-programmable gate array (FPGA). Also, implementation as an analogue circuit is conceivable. Combinations of such hardware devices and circuits are also possible.

Any electric fault in the electric system will affect process parameters PP, like electric voltages or currents, of a substation 100, 200. This allows the intrusion detection system 150, 250 to assess if a tripping command to a switching element 110, 210 is justified by an electric fault or is an attack-caused misoperation. This allows the intrusion detection system 150, 250 also to assess if a data message carries correct process parameter data. This is explained in the following with an example with reference to FIG. 2 and FIG. 3.

FIG. 2 shows the time curve of a three-phase voltage V and current I, e.g., with a nominal frequency of the electric power system 1, like for example 50 Hz, 60 Hz or 16.67 Hz. At time $t_F$, a phase-to-phase short circuit fault between two of the three phases occurs, i.e., the two phases are short circuited. This forces the voltages of the two faulty phases to be the same and to drop below their nominal values. The third voltage would remain unaffected in this example. At the same time, the currents in the faulty phases increase depending on the power system equivalent source and its characteristic. The third current would remain unaffected in this example.

In FIG. 3 a phase-to-ground short circuit fault is shown. At time $t_F$, a ground fault of a phase of a three-phase voltage occurs forcing the phase voltage of the faulty phase to drop to almost zero. The two other phase voltages would remain unchanged or experience an increase in the phase voltage as in this example.

When the at least one measurement unit 106, 206 acquires process parameter PP, e.g., phase voltages and phase currents, that corresponds to a faulty phase then the electric fault can be detected by evaluating the process parameter PP over time. It is therefore possible to detect electric faults by evaluating process parameters PP of the at least one measurement unit 106, 206.

In an electric power system 1, a measurement unit 106, 206 is associated with a protection and control device 120, 220, that receives process parameters PP from the associated measurement unit 106, 206, performs a protection and control function and triggers a switching operation of an associated switching element 110, 210 if need be. The association of measurement unit 106, 206, protection and control device 120, 220 and switching element 110, 210 is usually configured and given.

The process parameters PP are sent as a stream of sampled values (with a given or pre-set, but usually fixed and known, sampling rate), i.e., digitized, in successive data messages over the communication bus 130, 131, 230, 231. A fault detector 300 connected to the communication bus 130, 131, 230, 231 can thus be implemented that evaluates process parameter PP of electric phases of electric lines in a substation 100, 200. From the known expected time curve of a process parameter (phase voltage or a phase current, e.g., a 50 Hz voltage with a given nominal value), it is possible to detect any electric fault that manifests itself as deviation from the expected time curve. For example, a sudden change in a phase voltage or current hints at an electric fault.

The process parameters PP detected with the at least one measurement unit 106, 206 connected to the at least one process interface unit 107, 207 are sampled and sent several times per cycle of the electric signal with a given sampling rate $T_S$, e.g., 80 samples per cycle which leads to a sampling time of 250 µs for a 50 Hz electrical signal. This means that an electric fault can be detected much faster than a protective or control function in a protection and control device 120, 220 operates. A protective or control function typically operates in about one cycle to half cycle, i.e., in 20 ms to 10 ms in a 50 Hz system. That is, the protection and control device 120, 220 that is associated to the measurement unit 106, 206 requires the operation time of one cycle to half cycle to detect a faulty state and to trigger a switching action of a corresponding switching element 110, 210.

According to the invention a fault detector 300 detects an electric fault in a time period that is shorter than the operation time of a protection and control device 120, 220 and indicates the electric fault to an associated switching element 110, 210 faster than the operation time of the protection and control device 120, 220. The switching element 110, 210 performs a switching action upon receipt of the switching command from the corresponding protection and control device 120, 220 only if it has already received the indication of a corresponding electric fault from the fault detector 300. If it has not received the indication of a corresponding electric fault from the fault detector 300, the switching command may be blocked. The switching element 110, 210 may receive the electric fault indication and/or the switching command also via an associated process interface unit 107, 207 the switching element 110, 210 is connected to.

It is to be understood that in a substation 100, 200 usually several measurement units 106, 206 are installed and several process parameters PP are detected and sent in data messages over the communication bus 130, 131, 230, 231. Therefore, it is possible to implemented several fault detectors 300, e.g., in one or several intrusion detection systems 150, 250, that monitor process parameters PP of different measurement points in the electric power system 1. An electric fault will be detected at all measurement points that are electrically connected.

For example, in FIG. 1 generator 101 is electrically connected to transformer 103 and to bus bar 105, as well as to transmission line 2, bus bar 201, transformer 202 and bus bar 203. Along this connection there may be arranged several measurement units 106, 206 for detecting process parameters. An electric fault (e.g., phase-to-phase or phase-to-ground) that occurs somewhere along this electrical connection would be reflected in all process parameters of the arranged measurement units 106, 206.

An electric fault in the electric power system 1 could be determined in different ways by analyzing a process parameter PP over time. The expected time curve of the process parameter PP of an electric power system 1, preferably within a certain tolerance band, can be assumed to be known, e.g., an electric voltage or current with a certain frequency, phase (with respect to a reference) and amplitude. If a detected process parameter PP deviates from the expected time curve, then an electric fault can be assumed. It can also be assumed that a cycle (defined by the frequency of the process parameter PP) of the process parameter PP does usually not change significantly in consecutive cycles. Therefore, an actual value of a process parameter PP can be compared to past values in order to detect an electric fault.

A possible implementation of the fault detector 300 is explained with reference to FIG. 4. Process parameter PP (e.g., an electric voltage or current, or both) is received and stored in data storage 302 as time sequence of consecutive sampled values of the process parameter PP. The data storage 302 could also be arranged in the intrusion detection system 150, 250, when the fault detector 300 is implemented as software or could be an external data storage. The data storage 302 stores sampled values of the process parameters at a given sampling frequency $T_S$, which leads to a number Ns of sampled values per cycle, e.g., 80 samples per cycle. The data storage 302 stores the actual sampled value (indicated with index i) of the process parameter $PP_i$ and sampled values of at least one past cycle (i–j·Ns) of the process parameter $PP_{(i-j \cdot Ns)}$. The actual value of the process parameter $PP_i$ is compared with a corresponding past value of the process parameter $PP_{(i-j \cdot Ns)}$ of a past cycle of the process parameter. A corresponding past value $PP_{(i-j \cdot Ns)}$ of an actual value of the process parameter $PP_i$ is a value of the process parameter that lies an integer multiple (given by the integer j) of the period of the cyclic electric signal (1/nominal frequency) in the past. An electric fault is assumed if the deviation between the compared values exceeds a certain given limit $PP_{set}$. An electric fault could then be detected when the following condition holds $|PP_i - P_{(i-j \cdot Ns)}| > PP_{set}$, whereas j is a pre-set integer.

The comparison, e.g., the evaluation of the above condition, can be done in a fault evaluation unit 301, e.g., a microprocessor-based hardware that runs certain software or processes installed on the hardware. Fault evaluation unit 301 could be implemented as software that runs on computer hardware of fault detector 300 or of intrusion detection system 150, 250, but could also be implemented as separate device. Fault evaluation unit 301 may, however, also be implemented as programmable logic controller (PLC) or integrated circuit (IC) like an application-specific integrated circuit (ASIC) or field-programmable gate array (FPGA). Also, implementation as an analogue circuit is conceivable, as well as combinations of such hardware devices and circuits.

Instead of an absolute value of the difference between actual value of the process parameter $PP_i$ and the past value of the process parameter $PP_{(i-jNs)}$, the square (or any other power) of the difference could be used as well.

It is possible to compare the actual value of the process parameter $PP_i$ with a mean value of the process parameter $PP_{mean}$ of a number Nc of corresponding past cycles. A mean value of the process parameter $PP_{mean}$ of Nc past cycles could be calculated, for example, as arithmetic mean $$PP_{mean} = \frac{1}{Nc} \sum_{Nc} PP_{(i-Nc \cdot Ns)}.$$

Instead of an arithmetic mean also other mean values could be used, like the quadratic mean, geometric mean, power mean, for example. The condition for checking a fault could then be written as $|PP_i - PP_{mean}| > PP_{set}$. Instead of an absolute value of the difference between actual value of the process parameter $PP_i$ and the mean value of the process parameter $PP_{mean}$, the square (or any other power) of the difference could be used as well.

Comparisons as mentioned above and also calculations of mean values can easily be implemented and can be carried out in very short times, even on computer platforms with limited computing power.

In order to make the fault detection in the fault evaluation unit 301 more stable and unsusceptible to usual fluctuations of the value of the process parameter PP, it is also possible to evaluate if one of the above conditions is fulfilled for a number of consecutive actual values of the process parameter $PP_i$, for example five consecutive actual values. Only if the condition is fulfilled for this number of consecutive actual values, an electric fault is indicated.

This fault detection works for single phase or multiple-phase electrical systems. In a multiple-phase system, one of the above conditions could be checked for one or several phases.

Figure 4:
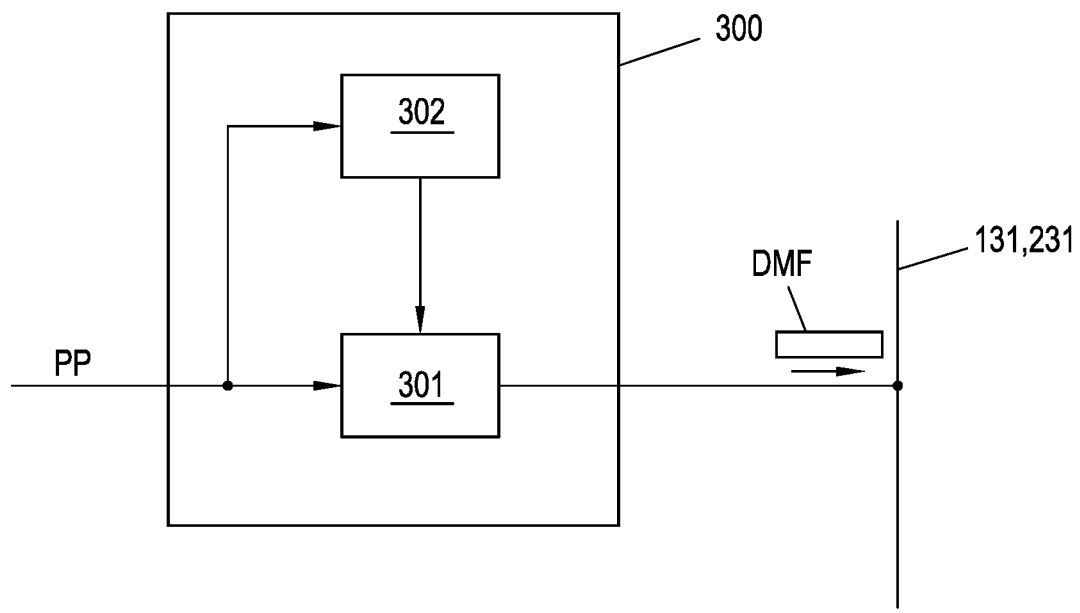
FIG. 4 show an implementation of a fault detector.

If an electric fault is detected by the fault detector 300, or the fault evaluation unit 301 of the fault detector 300, then a fault data message $DM_F$ may be sent over the communication bus 131, as shown in FIG. 4. The fault data message $DM_F$ is destined for the switching element 110, 210 associated to a measurement unit 106, 206 from which the process parameter PP originate. The fault data message $DM_F$ may also be sent several times over the communication bus 131. It is also possible to hard-wire the associated switching element 110, 210, or the process interface unit 107, 207 the switching element 110, 210 is connected to, to the fault detector 300, or the fault evaluation unit 301, to send a fault present indication, e.g., by an electric signal.

Figure 5:
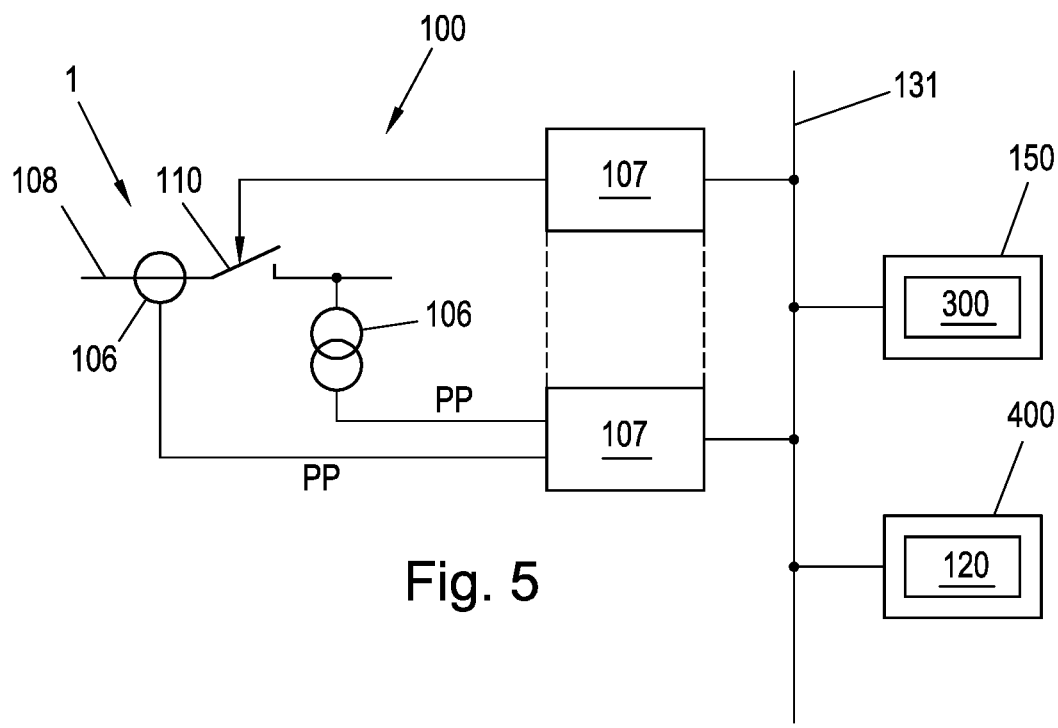
FIG. 5 show an example for operation of a switching element in the electric power system according to the embodiments.

In FIG. 5, an advantageous embodiment of the invention is depicted. In this embodiment, a switching element 110 is arranged in an electric line 108 (or any other primary element) in substation 100 of an electric power system 1. The switching element 110 establishes or interrupts flow of electric power over the electric line 108. The switching element 110 is connected to a process interface unit 107, which in turn is connected to communication bus 131. At least one measurement unit 106 is associated (e.g., by configuration) to the switching element 110, i.e., the measurement unit 106 detects a process parameter PP at the electric line 108 at which the switching element 110 is arranged. A process parameter PP is, for example, an electric current that flows over the switching element 110 when in closed state or an electric voltage at a terminal or between the terminals of the switching element 110. In the embodiment of FIG. 5 there are provided two measurement units 106 for detecting an electric current and voltage as process parameter PP. The process parameter PP of the at least one measurement unit 106 is sampled by a process interface unit 107 (that could be the same as the one the switching element 110 is connected to, as indicated in FIG. 4) in order to obtain digitized process parameter PP and the sampled values are sent as stream of data messages, each comprising a sampled value of the process parameter PP, over a communication bus 131. However, a measurement unit 106 may also directly send sampled values of the process parameter PP. An automation system 400, e.g., a PAC system or a substation automation system, reads the stream of data messages containing the process parameter PP and will trigger a switching operation of the associated switching element 110 if the received process parameter PP indicates any fault or erroneous state of the electric power system 1. The switching operation in case of a fault usually causes tripping of the switching element 110. The automation system 400 may comprise any protection and control device 120 (as in FIG. 5) or external control device 122. The switching operation may be triggered by sending a data message with the switching command over the communication bus 131 to the associated process interface unit 107 the switching element 110 is connected to or directly to the switching element 110.

A fault detector 300 is connected to the communication bus 131 and reads the data messages with the process parameters PP of the at least one measurement unit 106, that are sent, for example, by the process interface unit 107 the at least one measurement unit 106 is connected to. The fault detector evaluates the process parameter of the at least one measurement unit 106 and detects a possible electric fault, e.g., as described above. If an electric fault is detected by the fault detector 300, it sends a fault data message DMF comprising a fault present indication (that could be a certain Bit or coded word in the data sent in the data message) to the switching element 110 (also via the process interface unit 107 the switching element 110 is connected to as in FIG. 5). The switching element 110 performs the received switching command of the automation system 400 only if it has already received the fault present indication before. If it receives a switching command without having received a fault present indication, the switching command would not be executed. In this case, the process interface unit 107 the switching element 110 is connected to could sent a data message indicating a possible intrusion or malicious attack to the automation system 400.

The at least one measurement unit 106 could also be hard-wired to the automation system 400 for transmitting the acquired process parameter PP directly to the automation system 400. In this case the process parameter PP could be sampled in the automation system 400.

The fault detector 300 is integrated into an intrusion detection system 150 in FIG. 5. The fault detector 300 could, however, also be a separate device or could also be integrated into the process interface unit 107 connected to the switching element 110 or connected to the at least one measurement unit 106.

The fault present indication could also be sent in different ways to the switching element 110. The fault detector 300 could be hard-wired to the process interface unit 107 the switching element 110 is connected to for directly sending the fault indication, e.g., by way of an electrical signal. There could also be implemented a different data communication bus for sending the fault present indication in a fault data message DMF to the switching element 110. It is also possible to use different data communication protocols for sending data messages with process parameter PP and with a fault present indication.

After an occurring electric fault has been cleared by tripping the associated switching element 110, the fault detector 300 is reset. After tripping, the electric voltage and/or electric current, as detected process parameter PP (that is streamed in data messages), drop to zero or return to nominal value depending on the sources feeding the substation 100, 200 which can be detected by the fault detector 300. The fault detector 300 is therefore able to recognize the tripping action of the switching element 110. The fault detector 300 may reset when the tripping action has been recognized. The switching element 110 (or the process interface unit 107 it is connected to) may, however, also sent a trip indication data message after tripping the switching element 110. Such a trip indication data message of an associated switching element 110 may also be received by the fault detector 300 for resetting.

When the switching element 110 is closed again, e.g., by an operator, the fault detector 300 is able to realize this in the process parameters PP received and may start operation again.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A method for operating at least one switching element of an electric power system, the at least one switching element being arranged on a primary element of the electric power system that guides primary currents and primary voltages, and the at least one switching element being operated by an automation system of the electric power system, the method comprising:

sending a switching command from the automation system to the at least one switching element for triggering a tripping operation of the switching element;

detecting values of at least one electric process parameter of the electric power system by a measurement unit, the at least one process parameter being a cyclic electric signal of given frequency and nominal value;

streaming sampled values of the detected values of the at least one process parameter over a data communication bus in data messages of a data communication protocol implemented on the data communication bus;

evaluating the streamed values of the at least one process parameter by a fault detector connected to the data communication bus, in order to detect an electric fault in the electric power system;

sending a fault present indication to the at least one switching element by the fault detector when an electric fault is detected; and triggering the tripping operation of the at least one switching element only after the fault present indication has been received by the at least one switching element.

2. The method according to claim 1, further comprising:

connecting the automation system to the data communication bus;

connecting the at least one switching element to the data communication bus; and sending the switching command for triggering a tripping operation in a data message over the data communication bus to the switching element.

3. The method according to claim 1, further comprising connecting at least one of the measurement unit or the switching element to the communication bus via a process interface unit.

4. The method according to claim 1, further comprising sending the fault present indication in a fault data message over the data communication bus.

5. The method according to claim 3, wherein the process interface unit receives measured values of the at least one process parameter from the measurement unit, samples the at least one process parameter with a given sampling rate and sends the sampled values in data messages over the data communication bus.

6. The method according to claim 1, wherein the data messages with the sampled values of the at least one process parameter are received and evaluated by the automation system to detect an erroneous state of the electric power system, the automation system sending the switching command to the switching element when it detects an erroneous state.

7. The method according to claim 1, wherein the electric fault is detected in the fault detector by comparing at least one actual value of the at least one process parameter with a corresponding past value of the at least one process parameter of a past cycle of the process parameter.

8. The method according to claim 6, wherein the electric fault is detected in the fault detector by comparing an actual value of the at least one process parameter with a mean value of a number of corresponding past values of the at least one process parameter of past cycles of the process parameter.

9. An electric power system comprising:
- a primary element;
- at least one switching element arranged on the primary element that guides primary currents and primary voltages;
- an automation system that operates the at least one switching element, the automation system sending a switching command to the at least one switching element for triggering a tripping operation of the at least one switching element;
- a measurement unit for detecting values of at least one electric process parameter of the electric power system, the at least one process parameter being a cyclic electric signal of given frequency and nominal value;
- a data communications bus, the measurement unit being connected to the data communication bus over which sampled values of the at least one process parameter are streamed in data messages of a data communication protocol implemented on the data communication bus; and
- a fault detector that is connected to the data communication bus and evaluates the streamed values of the at least one process parameter, in order to detect an electric fault in the electric power system,
- wherein the fault detector is arranged to send a fault present indication to the at least one switching element when an electric fault is detected, and
- wherein the at least one switching element is configured to trigger the tripping operation of the at least one switching element only after the fault present indication has been received by the at least one switching element.

10. The electric power system according to claim 9, wherein the automation system and the at least one switching element are connected to the data communication bus, the automation unit sending the switching command for triggering a tripping operation in a data message over the data communication bus to the at least one switching element.

11. The electric power system according to claim 9, wherein at least one of the measurement unit or the at least one switching element is connected to the communication bus via a process interface unit.

12. The electric power system according to claim 10, wherein the fault detector sends the fault present indication in a fault data message over the data communication bus.

* * * * *